United States Patent [19]
Anderson

[11] Patent Number: 5,451,893
[45] Date of Patent: Sep. 19, 1995

[54] PROGRAMMABLE DUTY CYCLE CONVERTER

[75] Inventor: David J. Anderson, Ahwatukee, Ariz.

[73] Assignee: Samsung Semiconductor, Inc., San Jose, Calif.

[21] Appl. No.: 242,205

[22] Filed: May 13, 1994

[51] Int. Cl.$^6$ ........................ H03K 3/017; H03K 9/06
[52] U.S. Cl. .................... 327/174; 327/175; 327/35
[58] Field of Search ................ 327/24, 26, 174, 175, 327/35

[56] References Cited

U.S. PATENT DOCUMENTS

| | | | |
|---|---|---|---|
| 3,732,506 | 5/1973 | Dupuy | 332/9 T |
| 3,800,167 | 3/1974 | Smith | 307/265 |
| 3,875,492 | 4/1975 | Allert | 321/16 |
| 4,071,781 | 1/1978 | Kayalioglu | 307/265 |
| 4,245,167 | 1/1981 | Stein | 307/265 |
| 4,282,549 | 8/1981 | Balaban et al. | 358/150 |
| 4,736,118 | 4/1988 | Fischer | 307/268 |
| 4,814,637 | 3/1989 | Roessler et al. | 307/268 |
| 5,057,702 | 10/1991 | Kitagawa et al. | 307/268 |
| 5,396,479 | 3/1995 | Johann | 327/175 |

FOREIGN PATENT DOCUMENTS

3934319C1 11/1990 Germany .
52-25553  2/1977 Japan .

OTHER PUBLICATIONS

IBM Technical Disclosure Bulletin, vol. 17, No. 6, Nov. 1974, pp. 1639–1640.

Primary Examiner—Margaret R. Wambach
Attorney, Agent, or Firm—Skjerven, Morrill, MacPherson, Franklin & Friel; Mark P. Kahler

[57] ABSTRACT

A duty cycle converter is provided for converting a pulsed input signal exhibiting a first duty cycle to a pulsed output signal exhibiting a second duty cycle. The converter includes an output pulse generator which synchronizes the leading edge of each output pulse with the leading edge of each input pulse. A first capacitor is charged to a first voltage level in response to a first input pulse. A second capacitor is switchably coupled to the first capacitor and, in response to a second input pulse, causes the voltage across the first capacitor to decrease to a second voltage level. A third capacitor is charged to the first voltage level in response to the second input pulse. A comparator determines when the voltage on the third capacitor increases to become equal to the second voltage level on the first capacitor. The output pulse generator terminates the output pulse when the voltage on the third capacitor and the second voltage level on the first capacitor become equal, thus setting the trailing edge of the output pulse.

16 Claims, 4 Drawing Sheets

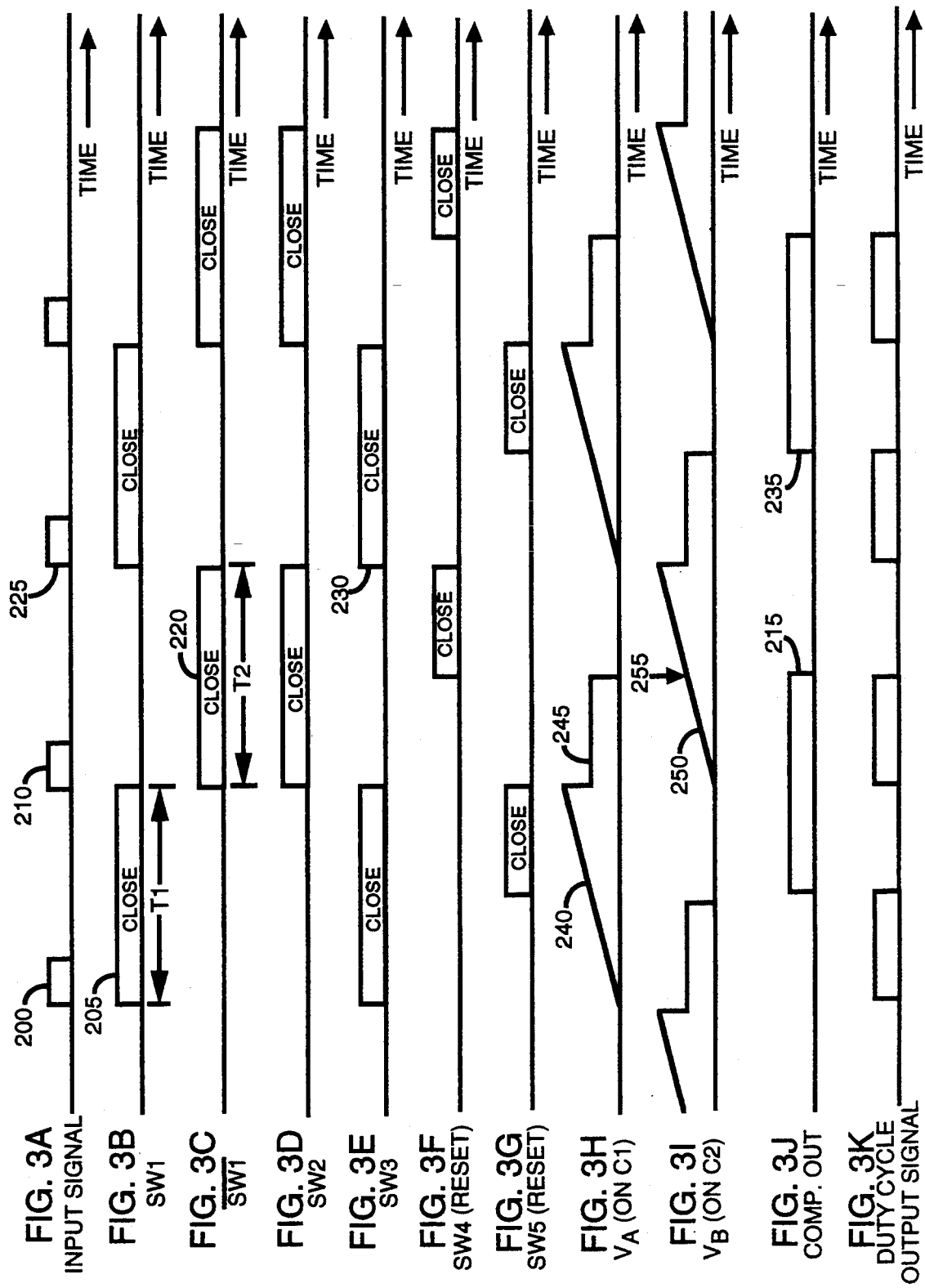

PROGRAMMABLE DUTY CYCLE CONVERTER

BACKGROUND OF THE INVENTION

1. Field of the Invention

This invention relates in general to pulse generating circuits and, more particularly, to pulse generating circuits which generate a pulse train exhibiting a predetermined duty cycle.

2. Description of Related Art

Situations arise in circuit design where it is desirable to convert a pulsed signal with one duty cycle to a pulsed signal exhibiting a different predetermined duty cycle. Many circuits which are designed to expect a predetermined duty cycle as an input do not function properly if they receive an input signal exhibiting other then the predetermined duty cycle. In this situation, it is desirable to convert a pulse signal with an arbitrary duty cycle into a signal with the predetermined duty cycle. This permits circuitry which has been designed to expect the predetermined duty cycle signal as an input to properly function.

For example, one approach is to employ a phase locked loop which doubles the frequency of the input pulse signal. An edge triggered toggle flip flop can then be used to generate the converted output signal. FIG. 1A shows an arbitrary pulsed input signal which is to be converted into a 50% duty cycle output waveform. FIG. 1B shows the phase locked loop (PLL) output signal which exhibits the doubled frequency. FIG. 1C shows the toggled flip flop output signal which triggers on each leading edge of the frequency doubled PLL output signal to generate a pulsed output signal. This pulsed output signal exhibits a predetermined 50% duty cycle despite the relatively low, arbitrary duty cycle of the input pulse signal shown in FIG. 1A. This approach successfully converts the duty cycle of an input pulse signal to a 50% duty cycle, but it is not without its disadvantages. For example, the PLL circuit is a relatively complex circuit with many parameters which must be defined. This contributes to the relatively high cost of the PLL approach in view of the task to be accomplished. Moreover, this technique can exhibit stability problems. Additionally, using this approach to create a duty cycle other than 50% typically involves increasing the signal frequency to many times the input frequency thus limiting the usefulness of the PLL approach for higher frequency systems.

SUMMARY OF THE INVENTION

One advantage of the duty cycle converter of the present invention is its relatively low complexity.

Another advantage of the duty cycle converter of the present invention is low cost.

In accordance with one embodiment of the present invention, a duty cycle converter is provided including an input for receiving an input pulsed signal. The input pulsed signal exhibits a first duty cycle and includes a plurality of input pulses having a leading edge and a trailing edge. The converter further includes an output pulse generator for generating an output pulse in response to each input pulse, each output pulse including a leading edge and a trailing edge, each output pulse being provided to an output of the output pulse generator. The output pulse generator includes synchronization apparatus for synchronizing the leading edges of the output pulses with the leading edges of respective input pulses. A timing apparatus is coupled to the output pulse generator for controlling the timing of the trailing edges of the output pulses. The timing apparatus includes first and second capacitors. The timing apparatus further includes a current source, switchably coupled to the first capacitor, the current source charging the first capacitor to a first voltage level in response to a first input pulse. The timing apparatus also includes a third capacitor, switchably coupled to the first capacitor, for discharging the first capacitor to a second voltage level in response to a second input pulse. The current source is switchably coupled to the second capacitor for charging the second capacitor in response to the second input pulse. The timing apparatus further includes a comparator, coupled to the first and second capacitors, for determining when the voltage on the second capacitor becomes equal to the second voltage level on the first capacitor and in response generating a transition in a comparator output signal. The output pulse generator is coupled to the comparator such that when a first output pulse is generated by the output pulse generator in response to the first input pulse, the transition in the comparator output signal causes the first output pulse to be terminated such that the trailing edge of the first output pulse occurs upon such transition.

BRIEF DESCRIPTION OF THE DRAWINGS

The features of the invention believed to be novel are specifically set forth in the appended claims. However, the invention itself, both as to its structure and method of operation, may best be understood by referring to the following description and accompanying drawings.

FIG. 3A ms a timing diagram of the input signal of the duty cycle converter of FIG. 2A.

FIG. 3B ms a timing diagram of the SW1 signal of the duty cycle converter of FIG. 2A.

FIG. 3C ms a timing diagram of the/SW1 signal of the duty cycle converter of FIG. 2A. FIG. 3D is a timing diagram of the SW2 signal of the duty cycle converter of FIG. 2A.

FIG. 3E is a timing diagram of the SW3 signal of the duty cycle converter of FIG. 2A.

FIG. 3F is a timing diagram of the SW4 reset signal of the duty cycle converter of FIG. 2A.

FIG. 3G is a timing diagram of the SW5 reset signal of the duty cycle converter of FIG. 2A.

FIG. 3H is a voltage vs. time diagram showing the voltage present on capacitor C1 in one embodiment of the duty cycle converter.

FIG. 3I is a voltage vs. time diagram showing the voltage present on capacitor C2 in one embodiment of the duty cycle converter.

FIG. 3J is a timing diagram of the output signal of the comparator of FIG. 2A.

FIG. 3K is a timing diagram of the output signal of the duty cycle converter of FIG. 2A.

DETAILED DESCRIPTION OF THE INVENTION

Figure 2A:
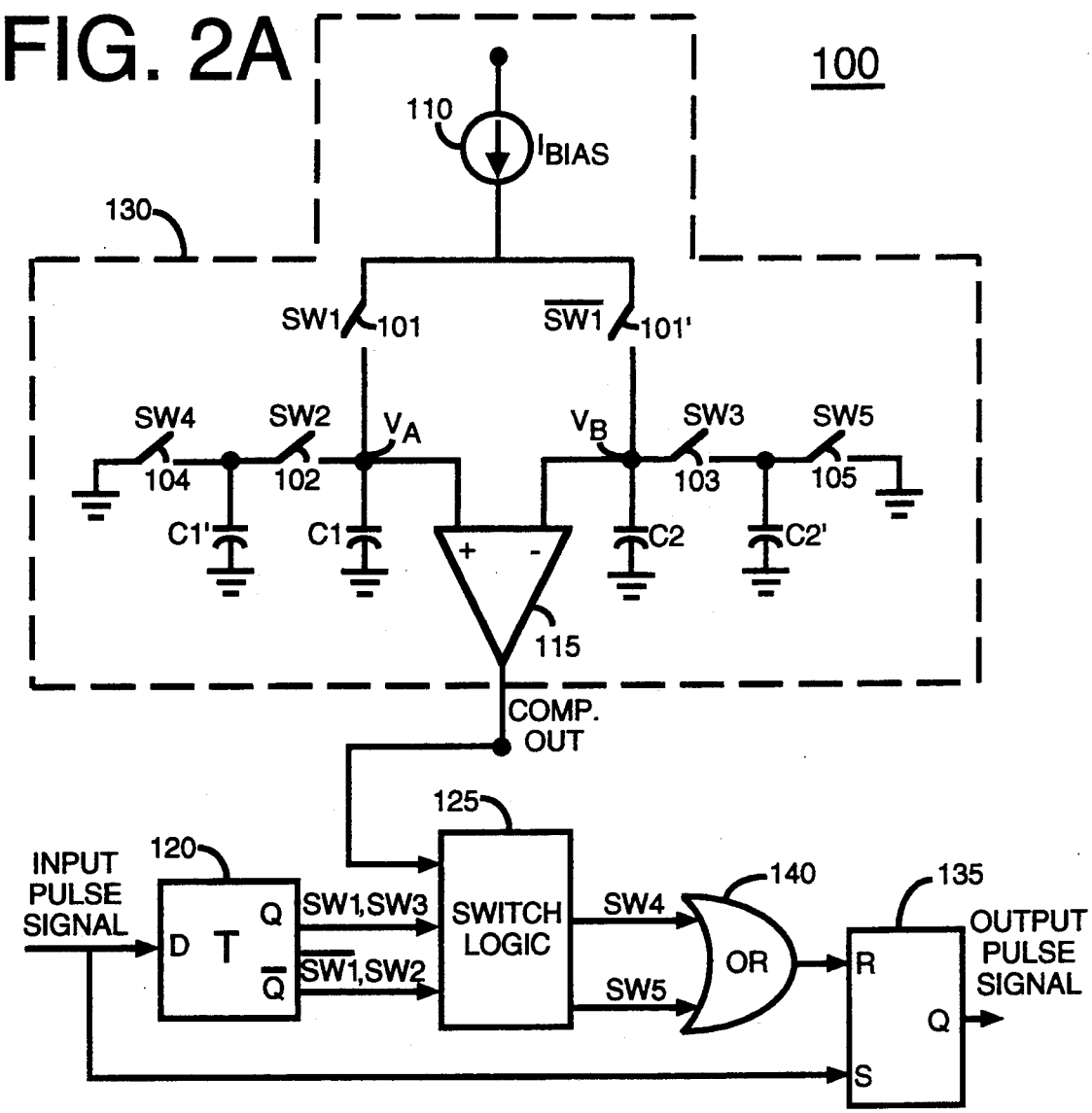
FIG. 2A ms a schematic diagram of the duty cycle converter of the present invention.

FIG. 2A shows a schematic diagram of a duty cycle converter in accordance with the present invention as converter 100. This particular converter 100 processes an input pulsed signal (FIG. 3A) having a predetermined frequency F1 with an arbitrary duty cycle. Converter 100 converts the input pulsed signal into an output pulsed signal (FIG. 3K) having a frequency F1 and a 50 percent duty cycle.

Converter 100 includes switches 101, 101', 102, 103, 104 and 105 to which switching control signals SW1, /SW1, SW2, SW3, SW4 and SW5 are supplied, respectively. Switches 101, 101', 102, 103,104 and 105 are coupled together as shown in FIG. 2A. A bias current source 110 depicted as current source, $I_{BIAS}$, is coupled to switches 101 and 101' as shown. The bias current from current source 110 charges capacitors C1, C1', C2 and C2' in a controlled manner determined by switch control signals SW1, /SW1, SW2, SW3, SW4 and SW5 as now described in more detail.

More particularly, switch 101, to which switch control signal SW1 is provided, is coupled between current source 110 and voltage node $V_A$. Voltage node $V_A$ is coupled to the positive input or reference input of a comparator 115. Voltage node $V_A$ is also coupled via capacitor C1 to ground such that current source 110 can charge capacitor C1 in a controlled manner when permitted by switch 101. Converter 100 also includes a capacitor C1' one end of which is coupled via a switch 102 to voltage node VA- The remaining end of capacitor C1' is coupled to ground. Switch 102 is controlled by switching control signal SW2 which is supplied thereto. The juncture of capacitor C1' and switch 102 is coupled via switch 104 to ground. A switching control signal SW4 is provided to switch 104 so that capacitor C1' can be reset or discharged at the appropriate time.

A switch 101', to which switch control signal /SW1 is provided, is coupled between current source 110 and voltage node $V_B$. Voltage node VB is also coupled to the negative or inverting input of comparator 115. Voltage node $V_B$ is further coupled via capacitor C2 to ground such that current source 110 can charge capacitor C2 in a controlled manner when permitted by switch 101'. Converter 100 also includes a capacitor C2' one end of which is coupled via a switch 103 to voltage node $V_B$. The remaining end of capacitor C2' is coupled to ground. Switch 103 is controlled by switching control signal SW3 which is supplied thereto. The juncture of capacitor C2' and switch 103 is coupled via a switch 105 to ground. A switching control signal SW5 is provided to switch 105 so that capacitor C2' can be reset or discharged at the appropriate time.

In this manner, a capacitor charging circuit 130 is formed which includes capacitors C1, C1', C2, C2', switches 101-105, $I_{BIAS}$ source 110 and comparator 115. In converter 100, the leading edge of each output pulse is synchronized with the leading edge of each input pulse. On an input pulse by input pulse basis, capacitor charging circuit 130 aids in measuring the time from the beginning of each input pulse to the time at which the corresponding output pulse should terminate in order to achieve the desired duration duty cycle.

The input pulse signal shown in FIG. 3A is provided to the D input of a toggle flip flop 120. In response, the switching control signals SW1 and SW3 are generated at the Q output of flip flop 120. Switching control signals /SW1 and SW2 are generated at the/Q output of flip flop 120. The Q and/Q outputs of toggle flip-flop 120 are coupled to switch logic 125 which, in response, provides reset signals SW4 and SW5. The switching control signals SW1, /SW1, SW2, SW3, SW4 and SW5 are shown graphically in FIGS. 3B-3G. The comparator output signal (COMP. OUT of FIG. 3J) which aids in providing the output pulse signal with the desired duty cycle is coupled to switch logic 125 as an input thereof.

As seen in FIG. 2A, the input pulse signal is provided to the S input of an RS flip flop 135. In this manner, whenever the leading edge of an input pulse occurs, the leading edge of an output pulse occurs at the Q output of the RS flip flop 135. The leading edge of each output pulse is thus synchronized with the leading edge of each input pulse.

The time at which the R input of the flip flop 135 is reset determines the duty cycle or duration of each output pulse at the Q output of RS flip flop 135. To facilitate setting the output pulse time duration, the SW4 and SW5 switching control signals from switch logic 125 are provided to respective inputs of a two input OR gate 135. Whenever one of reset signals SW4 and SW5 are high, the R input of RS flip flop 135 is driven high such that the Q output is reset to terminate the duration of a particular output pulse.

Figure 2B:
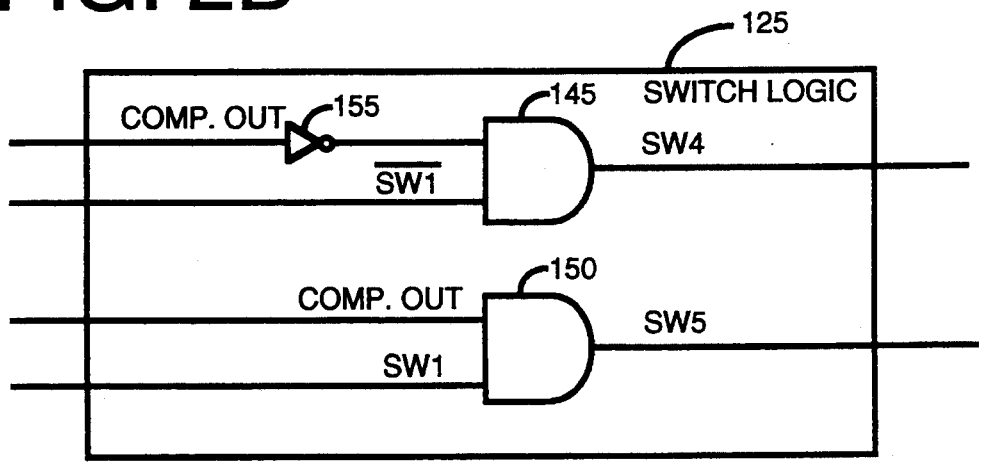
FIG. 2B is a schematic diagram of switching logic which is employed by the duty cycle converter of FIG. 2A.

The details of switch logic 125 are shown in FIG. 2B. Switch logic 125 includes two-input AND gates 145 and 150. The comparator output signal, COMP. OUT, is inverted by inverter 155 and is then provided to one input of AND gate 145. The remaining input of AND gate 145 is provided with the/SW1 switching control signal, In this manner, whenever the/SW1 signal goes high at the same time that the COMP. OUT signal goes low, reset signal SW4 goes high. This is confirmed by a comparison of FIG.'s 3C, 3J and 3F.

The comparator output signal, COMP. OUT, is also provided to one input of AND gate 150 as shown in FIG. 2B. The remaining input of AND gate 150 is provided with the SW1 switching control signal. In this manner, whenever the SW1 signal goes high at the same time that the COMP. OUT signal goes high, reset signal SW5 goes high. This is confirmed by a comparison of FIG.'s 3B, 3J and 3G.

The operation of duty cycle converter 100 is now described in more detail. An arbitrary input pulsed signal shown in FIG. 3A is provided to the D input of a toggle flip flop 120 and also to the S input of RS flip flop 135. The leading edge of each duty cycle output signal of FIG. 3K is thus synchronized with the leading edge of each input signal pulse. Flip flop 120 includes a Q output which generates the SW1 switching control signal and a/Q output which generates the/SW1 switching control signal shown in FIG.'s 3B and 3C, respectively. The remaining switching control signals SW2, SW3, SW4 and SW5 are shown in the timing diagrams of FIG.'s 3D, 3E, 3F, and 3G respectively.

The arrival of one of the input pulses of the input pulsed signal of FIG. 3A causes toggle flip flop 120 to generate SW1 and/SW1 control signals which close either switch 101 or 101'. For purposes of example, it is assumed that converter 100 receives an input pulse 200 (FIG. 3A) which causes toggle flip flop 120 to generate a high SW1 signal pulse 205 (FIG. 3B) which closes switch 101. For the duration of the high SW1 signal pulse 205, the/SW1 signal of FIG. 3C is low and the SW2 signal of FIG. 3D is low. Thus, switch 101' and switch 102 are open for the duration of the high SW1 signal pulse 205 and, in response, $I_{Bias}$ current source 110 charges capacitor C1 up to a voltage, V1, during this time. The voltage at node $V_A$ thus assumes a value V1. FIG. 3H is a timing diagram which shows voltage $V_A$ over time to demonstrate the charging and discharging of capacitor C1 over time. FIG. 3I is a timing diagram which shows voltage $V_B$ over time to demonstrate the charging and discharging of capacitor C2 over time.

Current source 110 charges capacitor C1 for the duration of a time period, T1, until the leading edge of the next input pulse 210 arrives at the input of converter 100. Capacitor C1 is charged as indicated at 240 in FIG. 3H. When the arrival of input pulse 210 occurs, toggle flip flop 120 changes state such that the SW1 signal of FIG. 3B goes low and the/SW1 signal of FIG.3C goes high. Toggle flip flop 120 also causes the SW2 signal of FIG. 3D to go high at this time. In response to these control signal changes, the low SW1 signal causes switch 101 to open thus removing the source of charging current from capacitor C1. Charging of capacitor C1 thus ceases. The high SW2 signal causes switch 102 to close such that the charge from capacitor C1 is now distributed to capacitor C1' and the voltage across capacitor C1 decreases as shown in FIG. 3H at 245.

Once capacitor C1' is so charged, the voltage across capacitor C1 (namely the voltage at node $V_A$) has decreased and is now given by Equation 1 below.

$$V1' = V1 \left( \frac{C1}{C1 + C1'} \right)$$  Equation 1

Thus, when capacitor C1 and C1' have equal capacitance values (ie. when C1=C1'), then a divide by two is performed such that the voltage V1', across capacitor C1 becomes equal to one half the voltage V1. A voltage V1' equal to one half the voltage V1 is thus supplied to the reference input of comparator 115.

Since during this same time period when capacitor C1' is being charged, the/SW1 signal provided to switch 101' has also gone high, switch 101' closes and $I_{BIAS}$ current source 110 charges capacitor C2. The voltage at node $V_B$ thus assumes a value V2. As seen in FIG. 3E, switching control signal SW3 is low during this time period such that switch 103 is open to permit all of the bias current from IBiAS current source 110 to charge capacitor C2 as indicated at 250 in FIG. 3I. It is assumed in this particular example that the values of capacitors C2 and C2' are equal to each other and to capacitors C1 and C1'. For example, a capacitance value of 25 picofarads may be employed for capacitors C1, C1', C2 and C2. When capacitor C2 charges up, it will only take ½ of the charging time T1 to reach the voltage level which is presently on capacitor C1 at node $V_A$ since that level has been halved. Thus, the voltage at node $V_B$ which is supplied to the negative signal input of comparator 115 will cross the voltage value supplied to the reference (positive) signal input of comparator 115 in one half the charging time T1. When this event occurs, namely when the voltage level at the two inputs of comparator 115 become equal (as indicated at 255 in FIG. 3I), the output of comparator 115 changes state as seen at 215 in FIG. 3J. In this particular embodiment, the comparator output goes low at this event as seen by the trailing edge 215 of the comparator output signal. However, it will be appreciated that converter 100 can also be arranged so that the comparator output signal goes high at this point if that is desired for a particular application.

The above described process of charging capacitor C1 for a predetermined charging time T1 and then halving the voltage on capacitor C1 by coupling another capacitor C1' to capacitor C1 is now repeated when the next input pulse 210 arrives except that it is carried out on capacitor C2 and capacitor C2'. More particularly, capacitor C2 charges up when switching control signal/SW1 of FIG. 3C goes high as indicated at 220 such that switch 101' is closed for a time duration T2. Capacitor C2 charges up to a voltage level V2. Switch 103 is opened by a low SW3 signal for this time period T2 to permit the full $I_{BIAS}$ current to charge capacitor C2. When the leading edge of the next input pulse 225 arrives, the/SW1 signal goes low to open switch 101'. Charging of capacitor C2 thus ceases. At the same time, the SW3 signal (FIG. 3E) goes high at 230 to close switch 103. This action causes the charge on capacitor C2 to be distributed to capacitor C2'. In this manner, the voltage V2' now present on capacitor C2, namely voltage $V_B$, is one-half V2. At the same time that switch 103 is closed by the action of the SW3 signal going high, switch 101 is again closed by the action of the SW1 signal such that the voltage $V_A$ on capacitor C1, and hence the positive input of comparator 115, begins to rise. In this instance, the V2' or ½ V2 voltage at the negative input of comparator 115 acts as the comparator's reference voltage. When the voltage VA on the positive input of comparator 115 rises to equal the voltage $V_B$ on the negative input of comparator 115, the output signal of comparator 115 switches state as indicated at 235 in FIG. 3J.

The above described process is continued in a similar fashion for the subsequent pulses of the input pulsed signal of FIG. 3A to produce the comparator output signal of FIG. 3J and the output pulsed signal of FIG. 3K. As seen by comparison of the input and output signals of FIG.'s 3A and 3K, the pulsed output signal exhibits a duty cycle which is 50%. Moreover, the pulsed output signal exhibits a frequency which is equal to the frequency of the pulsed input signal.

It is noted that each time comparator 115 changes output state, either capacitor pair C1-C1' or capacitor pair C2-C2' is reset to zero voltage by appropriate switching action. More particularly, when comparator 115 changes state as indicated at 215 in the output signal of FIG. 3J, the SW4 signal of FIG. 3F goes high to close switch 104. This action causes any voltage on capacitor C1' to be shunted to ground. Since switch 102 is already closed due to a high SW2 signal as shown in FIG. 3D, any voltage present on capacitor C1 is also shunted to ground when switch 104 is closed by the high SW4 signal. Capacitor pair C1-C1' is thus reset.

Similarly, when comparator 115 changes state as indicated at 235 in the comparator output signal of FIG. 3J, the SW5 signal of FIG. 3G goes high to close switch 105. This action causes any voltage on capacitor C2' to be shunted to ground. Since switch 103 is already closed due to a high SW3 signal as shown in FIG. 3E, any voltage present on capacitor C2 is also shunted to ground when switch 105 is closed by the high SW5 signal. Capacitor pair C2-C2' is thus reset. Switching control signals SW4 and SW5 thus act as reset signals.

The current level flowing through capacitors C1, C1',C2 and C2' is chosen such that the charge-up time of these capacitors does not exceed available voltage for the capacitor plates. To maximize the accuracy of the duty cycle conversion, the capacitor values employed for these capacitors should be matched as closely as possible. The accuracy of converter 100 is also dependent on the linearity of current source 110. One current source that can be used as current source 110 is a cascode current source.

On a pulse by pulse basis, the input pulses are provided to the S input of RS flip flop 135. Thus, the leading edge of each output pulse is determined by and synchronized with the leading edge of a respective input pulse. The trailing edge of each output pulse is determined by the timing apparatus formed by capacitor charging circuit 130 in combination with toggle flip-flop 120, switch logic 125 and OR gate 140. In this particular embodiment, each of capacitors C1 and C2 is charged up to a particular voltage V1 on alternate (every other) input pulse. For example, on a first input pulse, the voltage on capacitor C1 is charged up to voltage V1 and is then cut in half. On the next input pulse, capacitor C2 is charged up to V1. However, the voltage on C2 matches the ½ V1 voltage on capacitor C1 in one half the full C1 charge up time. Comparator 115 transitions when this match occurs. This charging operation is now repeated except that when C2 becomes fully charged to voltage V1, the voltage on C2 is now cut to one half V1 and capacitor C1 starts to charge up upon reception of the next input pulse. When the voltage on C1 matches the voltage on C2, the comparator again transitions. The times at which the comparator transitions in this manner provides timing information which is used by RS flip flop to set the time of termination (RESET) of each output pulse. The duration of each output pulse, namely the duty cycle of the output pulse signal, is thus controlled.

Comparator transition information is provided as the COMP. OUT signal to an input of switch logic 125 which is shown in detail in FIG. 2B. The SW1 signal and its complement, the/SW1 signal, produced by toggle flip flop 120, represent the pulse to pulse duration associated with the input pulses. With respect to the SW1 signal, switch logic 125 ANDs the SW1 signal with the COMP. OUT signal. Whenever both the SW1 signal and the COMP. OUT signal are high, a high SW5 reset signal is produced by switch logic 215. With respect to the/SW1 signal, switch logic 125 ANDs the/SW1 signal with the complement of the COMP. OUT signal. Whenever both the/SW1 signal and the complement of the COMP. OUT signal are high, a high SW4 reset signal is produced by switch logic 215. Since the SW4 and SW5 reset signals are applied to the two inputs of OR gate 140, the SW4 and SW5 signals are both passed through to the RESET input R of RS flip flop 135. Thus, when either the SW4 or SW5 reset signals transitions to a high state, the output Q of RS flip flop 135 is reset and the duration of the corresponding output pulse is terminated.

It is noted that the transitions of the COMP. OUT signal correspond to the leading edges of the SW4 and SW5 reset signals which set the end of each output pulse. Thus, the transitions of the COMP. OUT signal correspond to the trailing edges of respective output pulses and the COMP.OUT signal controls the actual duration or duty cycle exhibited by the output pulses.

A truth table depicting the R and S input states and the corresponding Q output states of RS flip flop 135 is shown below as Table 1.

TABLE 1

| (RS FLIP FLOP TRUTH TABLE) | | |
|---|---|---|
| S | R | $Q^{n+1}$ |
| 0 | 0 | $Q^n$ |
| 1 | 0 | 1 |
| 0 | 1 | 0 |
| 1 | 1 | 0 |

In TABLE 1, $Q^n$ represents the last output state of RS flip flop 135 and $Q^{n+1}$ is the present output state of flip flop 135. In one particular implementation, whenever both the S and R inputs are high, the R or RESET input dominates as seen in the truth table.

Figure 4:
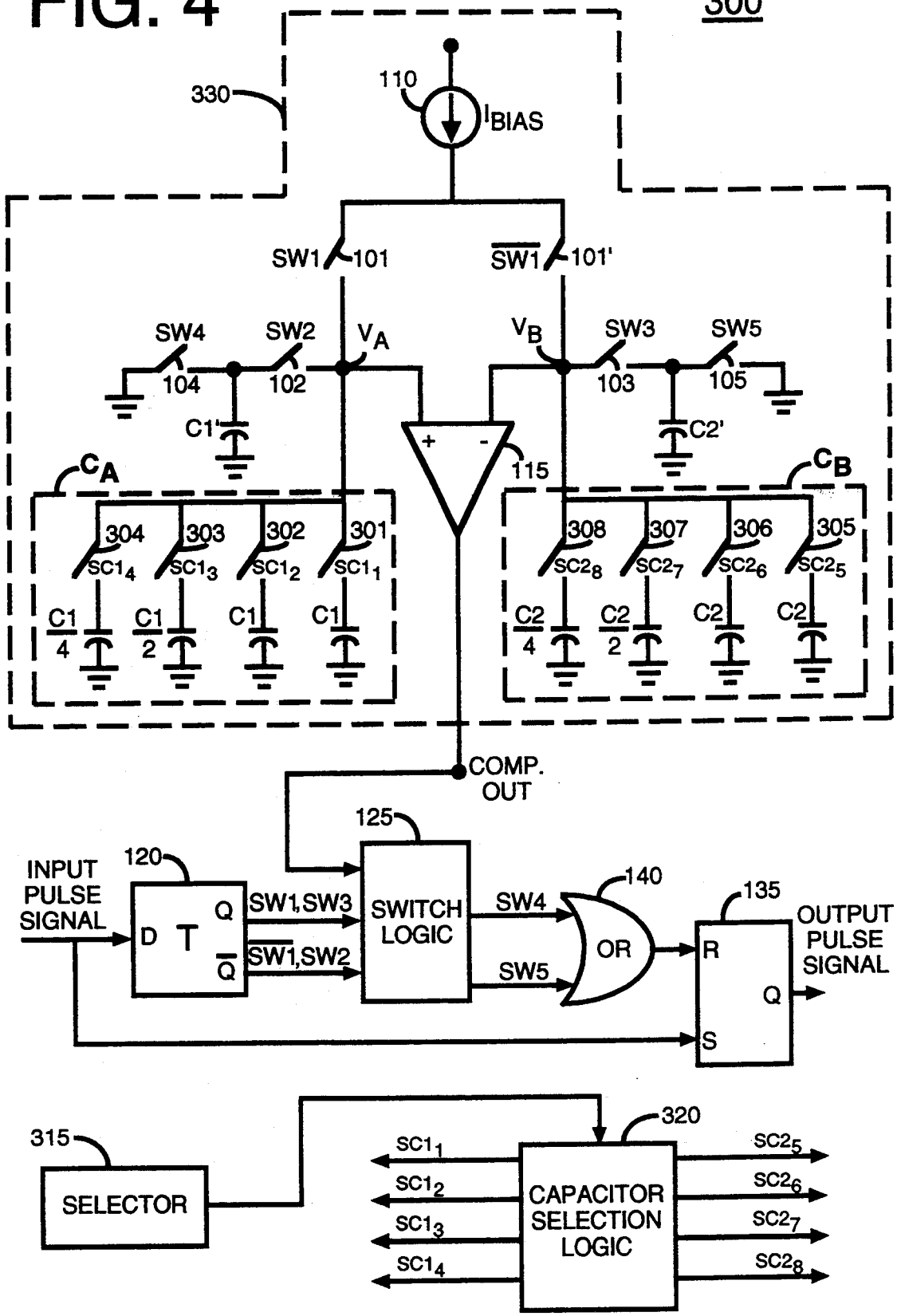
FIG. 4 is a schematic diagram of another embodiment of the present invention wherein the duty cycle exhibited by the duty cycle converter is programmable.

FIG. 4 shows another embodiment of the duty cycle converter of the present invention as converter 300. The particular duty cycle which is provided to the output pulsed signal by converter 300 is advantageously programmable. Converter 300 includes many elements which are similar to those of converter 100 of FIG. 2. Like numbers are used to indicate like elements in comparing converter 300 with converter 100. The modified elements of converter 300 which enable converter 300 to provide a programmable or user-selectable duty cycle are now discussed. Rather than including a single capacitor C1 as does converter 100 which provides a fixed duty cycle output, converter 300 includes a capacitor $C_A$ formed from a plurality of capacitors C1, C1, C1/2 and C1/4 which are selectively switchably coupled to node $V_A$ according to the particular output duty cycle desired. Similarly, in place of capacitor C2 of converter 100, converter 300 includes a capacitor CB formed from a plurality of capacitors C2, C2, C2/2 and C2/4 which are selectively switchably connected to node $V_B$.

Capacitors C1, C1, C1/2 and C1/4 are respectively coupled to node $V_A$ by switches 301, 302, 303 and 304 to form a capacitor $C_A$. Capacitors C2, C2, C2/2 and C2/4 are respectively coupled to node $V_B$ by switches 305, 306, 307 and 308 to form a capacitor $C_B$. Capacitor selection logic circuit 320 generates capacitance value selection signals which open or close switches 301, 302, 303, 304, 305, 306, 307 and 308 to connect the capacitors coupled thereto according to the particular output duty cycle desired. A capacitor charging circuit 330 is formed by current source 110, capacitors C1 and C1', capacitors $C_A$ and $C_B$, switches 101–105 and 301–308, and comparator 115 as seen in FIG. 4.

A higher capacitance is selected for capacitors $C_A$ and $C_B$ than the value of capacitors C1' and C2' if a duty cycle greater than 50% is desired for the output pulsed signal. A lower capacitance is selected for capacitors $C_A$ and CB than the value of capacitors C1' and C2' if a duty cycle less than 50% is desired for the output pulsed signal.

More particularly, the user activates a selector 315 which is coupled to capacitor selection logic 320 to indicate to converter 300 the particular capacitor selection needed according to the output duty cycle which is desired. Capacitor selection logic 320 generates switching signals $SC1_1$, $SC1_2$, $SC1_3$, $SC1_4$, and switching signals $SC2_5$, $SC2_6$, $SC2_7$, $SC2_8$ to control the opening and closure of capacitor switches 301, 302, 303, 304 and 305, 306, 307, 308, respectively.

For example, when the user employs selector 315 to select a capacitor C1 as the value for capacitor $C_A$, then capacitor selection logic 320 generates a high logic signal $SC1_1$ which causes switch 301 to be closed to connect a capacitor C1 to node $V_A$. The capacitance value $C_A$ equals C1 in this case. It is noted that the selection of capacitors by switching logic circuit 300 is symmetrical. In other words, if a particular capacitor of the group C1, C1, C1/2 and C1/4 is selected by closure of its switch, then a corresponding capacitor from the group C2, C2, C2/2 and C2/4 is also selected by capacitor selection logic 320 by closure of that capacitor's switch. If both capacitors C1/4 and C1/2 are selected from the group C1, C1, C1/2 and C1/4 to form capacitor $C_A$, then both capacitors C2/4 and C2/2 are selected from the group C2, C2, C2/2 and C2/4 to maintain symmetry and to form capacitor $C_B$. It is further noted that the capacitances of capacitors C1, C1', C2 and C2' are equal in this particular embodiment. In other embodiments of the invention, capacitors C1 and C1' may have unequal values and capacitors C2 and C2' may have unequal values. However, capacitors C1' and C2' should have equal capacitances.

Figure 1A:
FIG. 1A is a timing diagram of a pulsed input signal which is supplied to a conventional duty cycle converter.
Figure 1B:
FIG. 1B ms a timing diagram of the phase locked loop output signal in a conventional duty cycle converter.
Figure 1C:
FIG. 1C is a timing diagram of the output signal of a conventional duty cycle converter.

It was remarked earlier that in the particular example of converter 100 shown in FIG. 1, a 50% duty cycle output pulsed signal was derived from the input pulsed signal. If an output duty cycle greater than 50% is desired, then the user employs selector 315 to indicate to capacitor selection logic 320 that a capacitance having a total value greater than C1'(ie. greater than C1 in this case wherein C1 and C1' are equal) should be selected for coupling to node $V_A$ as capacitor $C_A$. For example, the user programs capacitor selection logic 320 to select both of the two capacitors designated $C_1$, namely those capacitors to which the $SC1_1$ and $SC1_2$ capacitance value selection signals are provided. In response, switches 301 and 302 are closed. Both of capacitors C1 are then connected to node $V_A$ as capacitor $C_A$. In symmetry with this action, capacitor selection logic 320 causes the $SC2_5$ and $SC2_6$ switching signals to go high to close switches 305 and 306. Both of capacitors C2 are then connected to node $V_B$ as capacitor $C_B$.

Once the $C_A$ and $C_B$ capacitances coupled to nodes $V_A$ and $V_B$ are selected, the process of charging the selected capacitance coupled to node $V_A$, closing switch 102 (via signal SW2) to distribute the charge to capacitor C1', closing switch 101' to charge the capacitance coupled to node $V_B$ and closing switch 103 to distribute the charge to capacitor C2' continues substantially as discussed earlier with respect to converter 100 of FIG. 2. Since the total capacitance coupled to nodes $V_A$ and $V_B$ is now greater than in the 50% duty cycle case described earlier, the voltage present at nodes $V_A$ and $V_B$ after charge distribution between capacitors CA and C1' and between capacitors $C_B$ and C2' is likewise greater than in the 50% duty cycle case. Thus, comparator 115 now takes a longer time to reach the point in time where both of its inputs exhibit an equal voltage. Since termination of each output pulse at RS flip flop 135 does not occur until comparator 115 transitions, an output pulsed signal exhibiting a longer duty cycle than in the 50% case thus results.

The same switching signals shown in FIG. 3B-3G and which were applied to converter 100 can be applied to converter 300 when it is programmed to produced an output signal with a duty cycle in excess of 50%. In other words, once the particular capacitor selection (C1, C1, C1/2, C1/4 and C2, C2, C2/2, C2/4) is made via capacitor selection logic 320 according to the particular duty cycle desired, then the same switching control signals (SW1-SW5) can be used as before. In a particular example wherein both C1 capacitors and both C2 capacitors are selected such that the capacitance coupled to node $V_A$ equals 2C1 and the capacitance coupled to $V_B$ equals 2C1, the duty cycle of the output pulsed signal is approximately 66%. It should be understood that other duty cycles in excess of 50% can be selected as well. For example, the user can program capacitor selection logic 320 to select capacitor pair C1-C1/4 and capacitor pair C2-C2/4. Alternatively, the user can program capacitor selection logic 320 to select capacitor pair C1- C1/2 and capacitor pair C2-C2/2 for a duty cycle greater than 50%.

Moreover, the same switching signals shown in FIG. 3B-3G and which were applied to converter 100 can be applied to converter 300 when it is programmed to produced an output signal with a duty cycle less than 50%. In a particular example wherein capacitor C1/2 is selected such that the capacitance coupled to node $V_A$ equals C1/2 and capacitor C2/2 is selected such that the capacitance coupled to $V_B$ equals C2/2, then the duty cycle of the output pulsed signal is approximately 33%. In this instance, the selected capacitance $C_A$ is less than the capacitances C1' and C2' such that after distribution of the charge between capacitors CA and C1' and between capacitors $C_B$ and C2', the voltage at $V_A$ and $V_B$ is less than in the case of the 50% duty cycle. In this case, it takes less time for the inputs of comparator 115 to achieve equal voltage values and comparator 115 transitions more quickly than in the 50% duty cycle case. Since on an input pulse by input pulse basis, comparator 115 is transitioning more quickly, RS flip flop 135 terminates each output pulse earlier than in the 50% duty cycle case. Thus, an output pulse signal exhibiting less than a 50% duty cycle results.

It should be understood that other duty cycles less than 50% can be selected as well. For example, the user can program capacitor selection logic 320 to select capacitor C1/4 and capacitor C2/4 to achieve such a duty cycle.

It is noted that capacitance value selection signals $SC1_1$, $SC1_2$, $SC1_3$, $SC1_4$ and capacitance value selection signals $SC2_5$, $SC2_6$, $SC2_7$, $SC2_8$ are applied to converter 300 to select the $C_A$ and $C_B$ capacitance values before the switching control signals SW1-SW5 are applied thereto. Once the $C_A$ and $C_B$ capacitances thus coupled to nodes $V_A$ and $V_B$ are selected at startup or initialization, these capacitance remain the same for the duration of operation of converter 300 at a particular duty cycle setting.

While a duty cycle converter apparatus has been described above, it is clear that a method for operating such a duty cycle converter apparatus is also disclosed. Briefly, a method of converting an input pulsed signal exhibiting a first duty cycle to an output pulsed signal exhibiting a second duty cycle is provided. The method includes the step of generating an output pulse in response to an input pulse. The input pulse includes a leading edge and a trailing edge. The output pulse also includes a leading edge and a trailing edge. The method further includes the step of synchronizing the leading edge of the output pulse with the leading edge of the input pulse. The method also includes the step of charging a first capacitor to a first voltage level in response to a first input pulse. The method further includes the step of coupling a second capacitor to the first capacitor in response to a second input pulse such that the voltage across the first capacitor decreases to a second voltage level. The method also includes the step of charging a third capacitor to the first voltage level in response to the second input pulse. The method includes the step of determining when the voltage on the third capacitor increases to become equal to the second voltage level on the first capacitor. The method further includes the step of terminating the output pulse when the voltage on the third capacitor and the second voltage level on the first capacitor become equal, thus setting the trailing edge of the output pulse.

The foregoing has described a duty cycle converter which converts a pulsed input signal exhibiting a first duty cycle into a pulsed output signal exhibiting a second duty cycle. The duty cycle converter is advantageously of low complexity and relatively low cost.

While only certain preferred features of the invention have been shown by way of illustration, many modifications and changes will occur. It is, therefore, to be understood that the present claims are intended to cover all such modifications and changes which fall within the true spirit of the invention.

What is claimed is:

1. A duty cycle converter comprising:
    an input for receiving an input pulsed signal including a plurality of input pulses having a leading edge and a trailing edge and exhibiting a first duty cycle;
    an output pulse generator for generating an output pulse in response to each input pulse, each output pulse including a leading edge and a trailing edge, each output pulse being provided to an output of the output pulse generator, the output pulse generator including synchronizing means for synchronizing the leading edges of the output pulses with the leading edges of respective input pulses;
    timing means, coupled to the output pulse generator, for controlling the timing of the trailing edges of the output pulses, the timing means including first and second capacitors;
    a current source, switchably coupled to the first capacitor, the current source charging the first capacitor to a first voltage level in response to a first input pulse;
    a third capacitor, switchably coupled to the first capacitor, for discharging the first capacitor to a second voltage level in response to a second input pulse;
    the current source being switchably coupled to the second capacitor for charging the second capacitor in response to the second input pulse; and
    a comparator, coupled to the first and second capacitors, for determining when the voltage on the second capacitor becomes equal to the second voltage level on the first capacitor and in response generating a transition in a comparator output signal;
    the output pulse generator being coupled to the comparator such that when a first output pulse is generated by the output pulse generator in response to the first input pulse, the transition in the comparator output signal causes the first output pulse to be terminated such that the trailing edge of the first output pulse occurs upon such transition.

2. The duty cycle converter of claim 1 wherein the output pulse generator comprises an RS flip flop.

3. The duty cycle converter of claim 1 wherein the capacitance of the first capacitor is equal to the capacitance of the second capacitor.

4. The duty cycle converter of claim 3 wherein the capacitance of the third capacitor is equal to the capacitance of the first capacitor.

5. The duty cycle converter of claim 3 wherein the capacitance of the third capacitor is greater than the capacitance of the first capacitor.

6. The duty cycle converter of claim 3 wherein the capacitance of the third capacitor is less than the capacitance of the first capacitor.

7. A duty cycle converter comprising:
    an input for receiving an input pulsed signal including a plurality of input pulses having a leading edge and a trailing edge and exhibiting a first duty cycle;
    an output pulse generator for generating an output pulse in response to each input pulse, each output pulse including a leading edge and a trailing edge, each output pulse being provided to an output of the output pulse generator, the output pulse generator including synchronizing means for synchronizing the leading edges of the output pulses with the leading edges of respective input pulses;
    timing means, coupled to the output pulse generator, for controlling the timing of the trailing edges of the output pulses; the timing means including first and second capacitors;
    a current source, switchably coupled to the first capacitor, the current source charging the first capacitor to a first voltage level in response to a first input pulse;
    a third capacitor, switchably coupled to the first capacitor, for discharging the first capacitor to a second voltage level in response to a second input pulse;
    the current source being switchably coupled to the second capacitor for charging the second capacitor in response to the second input pulse;
    resetting means, coupled to the first capacitor, for resetting the voltage on the first capacitor to zero prior to a third input pulse;
    a fourth capacitor, switchably coupled to the second capacitor, for discharging the second capacitor to the second voltage level in response to the third input pulse;
    the current source being switchably coupled to the first capacitor for charging the first capacitor in response to the third input pulse; and
    a comparator, coupled to the first and second capacitors, for generating a comparator output signal which exhibits a transition each time that the voltage on the second capacitor increases to equal the voltage on the first capacitor and each time that the voltage on the first capacitor increases to equal the voltage on the second capacitor;
    the output pulse generator being coupled to the comparator such that each output pulse is terminated when a respective transition in the comparator output signal occurs thus providing an output pulsed signal exhibiting a second duty cycle.

8. The duty cycle converter of claim 7 wherein the output pulse generator comprises an RS flip flop.

9. The duty cycle converter of claim 7 wherein the capacitance of the first capacitor is equal to the capacitance of the second capacitor.

10. The duty cycle converter of claim 9 wherein the capacitance of the third capacitor is equal to the capacitance of the first capacitor.

11. The duty cycle converter of claim 9 wherein the capacitance of the third capacitor is greater than the capacitance of the first capacitor.

12. The duty cycle converter of claim 9 wherein the capacitance of the third capacitor is less than the capacitance of the first capacitor.

13. The duty cycle converter of claim 7 wherein the first and second capacitors comprise variable capacitors.

14. The duty cycle converter of claim 13 further comprising a selector, coupled to the first and second capacitors, for selecting the capacitance value of the first and second capacitors to determine the duty cycle exhibited by the output signal.

15. A method of converting an input pulsed signal exhibiting a first duty cycle to an output pulsed signal exhibiting a second duty cycle, the method comprising:
  generating an output pulse in response to an input pulse including a leading edge and a trailing edge, the output pulse including a leading edge and a trailing edge;
  synchronizing the leading edge of the output pulse with the leading edge of the input pulse;
  charging a first capacitor to a first voltage level in response to a first input pulse;
  coupling a second capacitor to the first capacitor in response to a second input pulse such that the voltage across the first capacitor decreases to a second voltage level;
  charging a third capacitor to the first voltage level in response to the second input pulse;
  determining when the voltage on the third capacitor increases to become equal to the second voltage level on the first capacitor; and
  terminating the output pulse when the voltage on the third capacitor and the second voltage level on the first capacitor become equal, thus setting the trailing edge of the output pulse.

16. A method of converting an input pulsed signal exhibiting a first duty cycle to an output pulsed signal exhibiting a second duty cycle, the input pulsed signal including a plurality of pulses, the output pulsed signal including a plurality of pulses, the method comprising:
  generating an output pulse in response to each input pulse, each input pulse including a leading edge and a trailing edge, each output pulse including a leading edge and a trailing edge;
  synchronizing the leading edge of each output pulse with the leading edge of each input pulse;
  charging a first capacitor to a first voltage level in response to a first input pulse;
  coupling a second capacitor to the first capacitor in response to a second input pulse such that the voltage across the first capacitor decreases to a second voltage level;
  charging a third capacitor to the first voltage level in response to the second input pulse;
  determining when the voltage on the third capacitor increases to a level equal to the second voltage level on the first capacitor;
  terminating a first output pulse when the voltage on the third capacitor and the second voltage level on the first capacitor become equal, thus setting the trailing edge of the first output pulse;
  resetting the voltage on the first capacitor to zero;
  coupling a fourth capacitor to the third capacitor in response to a third input pulse such that the voltage across the third capacitor decreases to the second voltage level;
  charging the first capacitor to the first voltage level in response to the third input pulse;
  determining when the voltage on the first capacitor increases to a level equal to the second voltage level on the third capacitor; and
  terminating a second output pulse when the voltage on the first capacitor and the second voltage level on the third capacitor become equal, thus setting the trailing edge of the second output pulse of the output pulsed signal.

* * * * *

UNITED STATES PATENT AND TRADEMARK OFFICE
CERTIFICATE OF CORRECTION

PATENT NO. : 5,451,893
DATED : September 19, 1995
INVENTOR(S) : david J. anderson It is certified that error appears in the above-indentified patent and that said Letters Patent is hereby corrected as shown below:

Column 2, lines 36, 41, 46, 48 50, delete "ms" and insert -- is--.
Column 3, line 37, delete "-" and insert --.--.
Column 5, line 53, delete "IBiAS" and insert -- $I_{BIAS}$--.

Signed and Sealed this

Second Day of July, 1996

Attest:

BRUCE LEHMAN

Attesting Officer    Commissioner of Patents and Trademarks